United States Patent
Beyler et al.

(10) Patent No.: US 7,159,583 B2
(45) Date of Patent: Jan. 9, 2007

(54) TECHNIQUE FOR DRIVE CURRENT STABILIZATION OF AN AUTOMOTIVE IGNITION SYSTEM

(75) Inventors: Duane E. Beyler, Sharpsville, IN (US); Scott B. Kesler, Kokomo, IN (US)

(73) Assignee: Delphi Technologies, Inc., Troy, MI (US)

( * ) Notice: Subject to any disclaimer, the term of this patent is extended or adjusted under 35 U.S.C. 154(b) by 172 days.

(21) Appl. No.: 10/973,769

(22) Filed: Oct. 26, 2004

(65) Prior Publication Data

US 2006/0087787 A1    Apr. 27, 2006

(51) Int. Cl.
*F02P 1/00*    (2006.01)
*F02P 3/06*    (2006.01)

(52) U.S. Cl. ........................... 123/644; 123/594

(58) Field of Classification Search .............. 123/644, 123/594, 605, 609, 621, 623
See application file for complete search history.

(56) References Cited

U.S. PATENT DOCUMENTS

| 3,938,490 A | * | 2/1976 | Snyder et al. ........... 123/611 |
| 4,579,021 A | * | 4/1986 | Yamamuro et al. ......... 477/45 |
| 2004/0085068 A1 | * | 5/2004 | Zhu et al. ................. 324/382 |

* cited by examiner

*Primary Examiner*—John T. Kwon
(74) *Attorney, Agent, or Firm*—Jimmy L. Funke

(57) ABSTRACT

Drive current stabilization is achieved through the management of a drive current. The drive current may include a control current that is provided to a control terminal of a switch, a current limit input current that is provided to a current limit circuit associated with the switch and a stabilization current. The switch carries a load current responsive to a control signal on the control terminal. The magnitude of the control current is monitored and a magnitude of the stabilization current is increased responsive to a decrease in the magnitude of the control current to substantially maintain a magnitude of the drive current.

8 Claims, 4 Drawing Sheets

TECHNIQUE FOR DRIVE CURRENT STABILIZATION OF AN AUTOMOTIVE IGNITION SYSTEM

TECHNICAL FIELD

The present invention is generally directed to a technique for drive current stabilization and, more specifically, to a technique for drive current stabilization of an automotive ignition system.

BACKGROUND OF THE INVENTION

Frequently, modern automotive ignition systems have controlled an ignition coil current by modulating a control terminal, e.g., a gate, of a switching device, e.g., an insulated-gate bipolar transistor (IGBT), which provides a current path for a primary winding of an ignition coil. In such automotive ignition systems, it has generally been desirable for the current in the primary winding of the ignition coil to increase as quickly as possible, limited by an impedance of the primary winding, to a predetermined desired coil current limit level. Further, when the coil current limit level has been reached, it has generally been desirable for the coil current to smoothly transition to a steady-state value, with minimal oscillation during the transition.

In a typical automotive ignition system, when an IGBT is used as the switching device, a designed current of approximately 500 uA has been used to quickly charge a gate capacitance of the IGBT and raise an IGBT gate voltage above a turn-on gate threshold of the IGBT. However, when the IGBT gate capacitance is charged to a maximum voltage level, as typically determined by an ignition control integrated circuit, the gate voltage can be maintained with significantly less current than the current initially required to quickly charge the IGBT gate capacitance. After the gate is fully charged, the lower IGBT gate current requirement continues while the primary winding current is increasing to the desired coil current limit level. When the coil current limit level is reached, the IGBT gate voltage is reduced in an attempt to maintain a constant primary winding current.

In a typical automotive ignition system, the decrease in the IGBT gate voltage has been achieved through the use of a closed-loop feedback circuit, i.e., a gate control current limit circuit. When the IGBT gate voltage is reduced, a gate drive current source that is providing the IGBT gate charging current has generally increased its output current due to changes in the current source bias conditions. Thus, in order to reduce the IGBT gate voltage, the gate control current limit circuit has been required to sink the additional current. As mentioned above, in operation, the input current draw is at a maximum during the initial charging of the IGBT gate and subsequently reduces during the time that the primary winding current is increasing to the current limit level. Finally, the current draw again increases when the gate control current limit circuit reduces the IGBT gate voltage to control the primary winding current.

In input-powered automotive ignition systems, a supply current is provided from an associated control unit, through a series resistor that is either internal or external to the ignition control integrated circuit. Unfortunately, the fluctuation in the supply current provided by the control unit, through the series resistor, causes a proportional voltage fluctuation to the gate drive current source. This voltage fluctuation, under some input conditions, causes the gate control current limit circuit to repeatedly change from an open-loop condition (IGBT fully on) to a closed-loop condition (IGBT gate voltage controlled). This voltage oscillation, in turn, causes an undesired oscillation in the primary winding current.

What is needed is a drive current stabilization circuit that substantially maintains a constant current output from a current source that is driving a control terminal of a switching device that controls a primary winding current of an ignition coil, irrespective of the state of a current limit control loop.

SUMMARY OF THE INVENTION

The present invention is generally directed to a technique for drive current stabilization. According to one embodiment of the present invention, a drive current is received that includes a control current that is provided to a control terminal of a switch, a current limit input current that is provided to a current limit circuit associated with the switch and a stabilization current. The switch carries a load current responsive to the magnitude of a control signal on the control terminal. The magnitude of the control current is monitored and the magnitude of the stabilization current is increased responsive to a decrease in the magnitude of the control current to substantially maintain the magnitude of the drive current.

According to another aspect of the present invention, the magnitude of the stabilization current is reduced responsive to an increase in the magnitude of the current limit input current to substantially maintain the magnitude of the drive current. According to a different aspect of the present invention, the switch is one of an insulated-gate bipolar transistor (IGBT) or a field-effect transistor (FET).

These and other features, advantages and objects of the present invention will be further understood and appreciated by those skilled in the art by reference to the following specification, claims and appended drawings.

BRIEF DESCRIPTION OF THE DRAWINGS

The present invention will now be described, by way of example, with reference to the accompanying drawings, in which.

DESCRIPTION OF THE PREFERRED EMBODIMENTS

According to one embodiment of the present invention, a drive current stabilization circuit for an automotive ignition system is disclosed that maintains a constant current output from a current source that drives a control terminal, e.g., a gate, of a switch, e.g., a field-effect transistor (FET) or insulated-gate bipolar transistor (IGBT), that controls a current through a primary winding of an ignition coil. The present invention is generally applicable to drive current stabilization for automotive ignition systems that are input-powered, as well as automotive ignition systems that are battery-powered. Further, it is contemplated that the present invention is applicable to other environments where a switch is utilized to provide a current path for a coil or other load.

Figure 1:
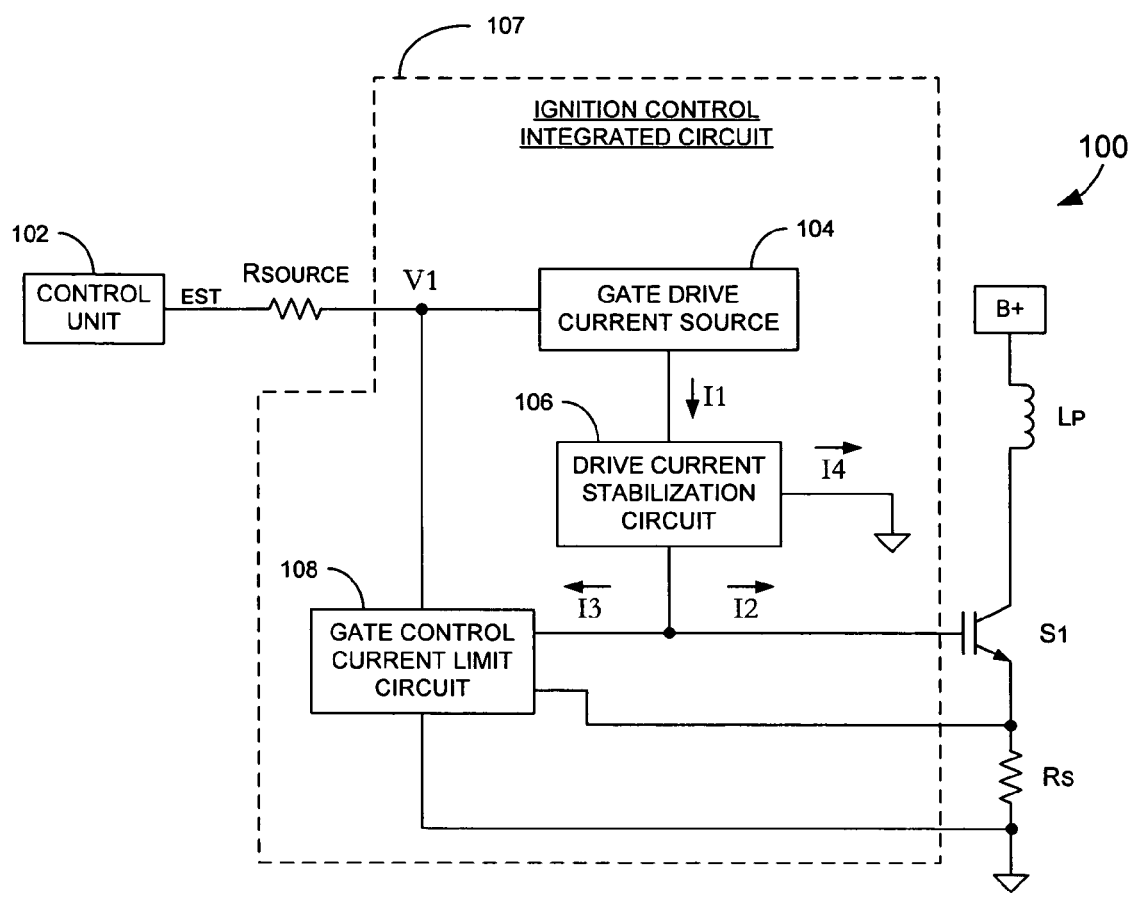
FIG. 1 is an electrical diagram, in block and schematic form, of an exemplary automotive ignition system that implements a drive current stabilization circuit constructed according to one embodiment of the present invention.

As is shown in FIG. 1, an automotive ignition system 100 includes a primary winding Lp of an ignition coil that is coupled between a battery B+ and a switch S1, e.g., a FET or an IGBT. An output terminal, e.g., an emitter, of the switch S1 is coupled to ground through a sense resistor Rs. A gate control current limit circuit 108 is coupled across the sense resistor Rs. The circuit 108 monitors a voltage developed across the resistor Rs to determine a magnitude of the current flowing through the primary winding Lp. The circuit 108 acts to limit the current through the primary winding Lp, when the current reaches a desired level. A control unit 102 provides an electronic spark timing (EST) signal V1 to a gate drive current source 104 and a gate control current limit circuit 108, via a resistor Rsource, e.g., a 470 Ohm resistor. The gate drive current source 104 provides a drive current I1 to a drive current stabilization circuit 106, constructed according to one embodiment of the present invention. The drive current stabilization circuit 106 provides a current limit input current I3 to an input of the gate control current limit 108 and a control current I2 to a gate of the switch S1. The drive current stabilization circuit 106, as required, sinks a stabilization current I4 to substantially maintain a magnitude of the drive current I1.

As is discussed above, in prior automotive ignition systems, which have not included the drive current stabilization circuit 106, a drive current I1 has been split between a current limit input current I3, which was used by the gate control current limit circuit 108, and a control current I2, which was used to charge the IGBT gate capacitance and turn on the switch S1. After the gate capacitance of the switch S1 was charged, the current I2 would cease flowing and, thus, the current I1 would decrease. This reduction in current would then cause the voltage V1 to increase. When the current through the sense resistor Rs had increased to a desired current limit level, the current I3 would increase to reduce the IGBT gate voltage. The increase in the current I3 would then cause an equal increase of the current I1 and, thus, the voltage V1 would decrease. It should be appreciated that this voltage change was generally undesirable as it can cause oscillation in the primary winding Lp current.

However, in automotive ignition systems that implement the drive current stabilization circuit 106, designed according to the present invention, when the current I2 decreases, the stabilization current I4 increases by an approximately equal amount. In this manner, the drive current I1 remains substantially constant (e.g., within +/−5 percent) and, as such, the voltage V1 also remains substantially constant. According to one embodiment, the gate control current limit circuit 108, the drive current stabilization circuit 106 and the gate drive current source 104 are integrated within an ignition control integrated circuit 107.

Figure 2A:
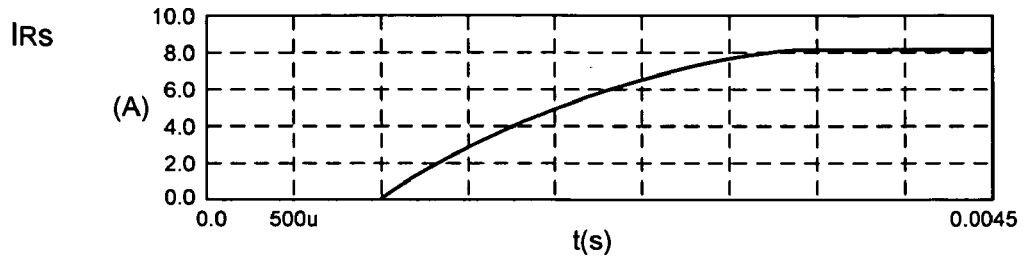
FIGS. 2A–2B are graphs depicting waveforms of a primary winding current of an ignition coil for a prior art automotive ignition system and an automotive ignition system that implements a drive current stabilization circuit constructed according to one embodiment of the present invention, respectively.
Figure 3A:
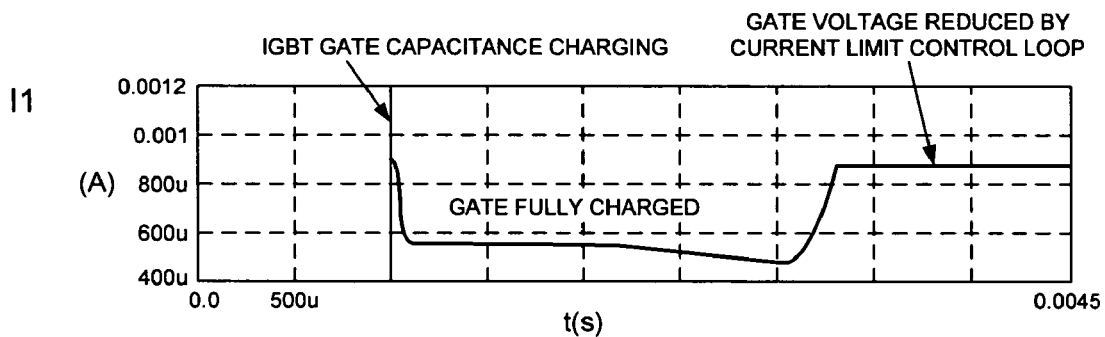
FIGS. 3A–3B are graphs depicting waveforms of a drive current for a prior art automotive ignition system and an automotive ignition system that implements a drive current stabilization circuit constructed according to one embodiment of the present invention, respectively.
Figure 4A:
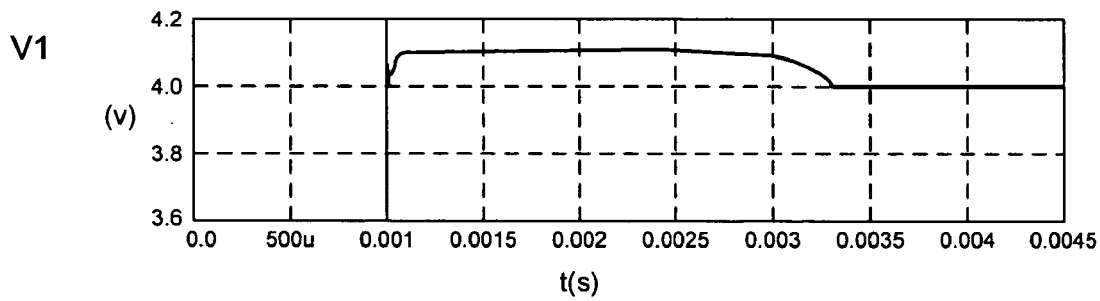
FIGS. 4A–4B are graphs depicting waveforms of a supply voltage for a prior art automotive ignition system and an automotive ignition system that implements a drive current stabilization circuit constructed according to one embodiment of the present invention, respectively.
Figure 2B:
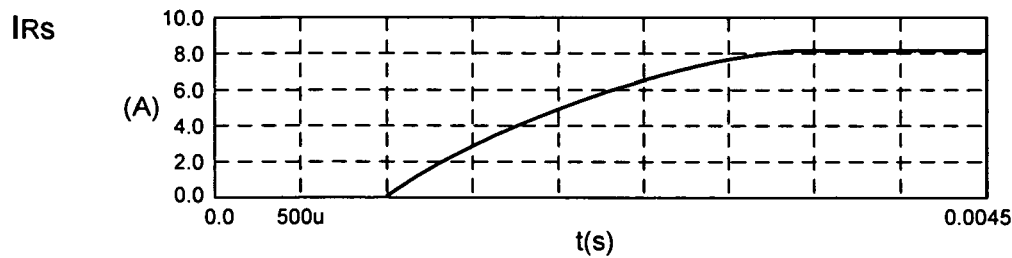
Figure 3B:
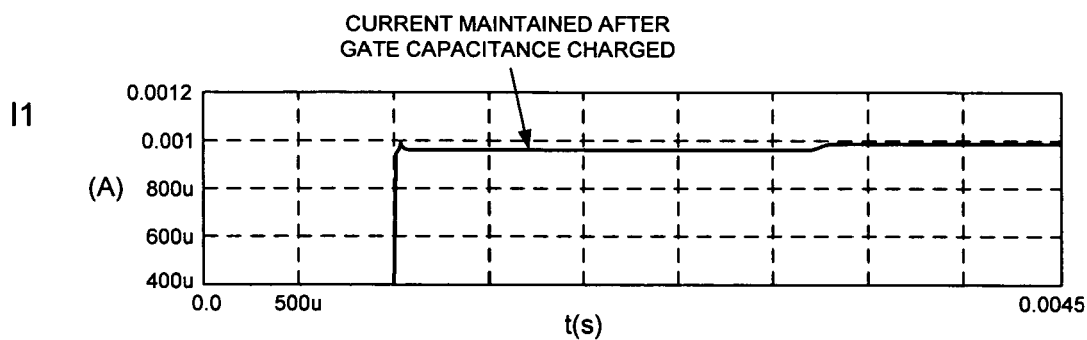
Figure 4B:
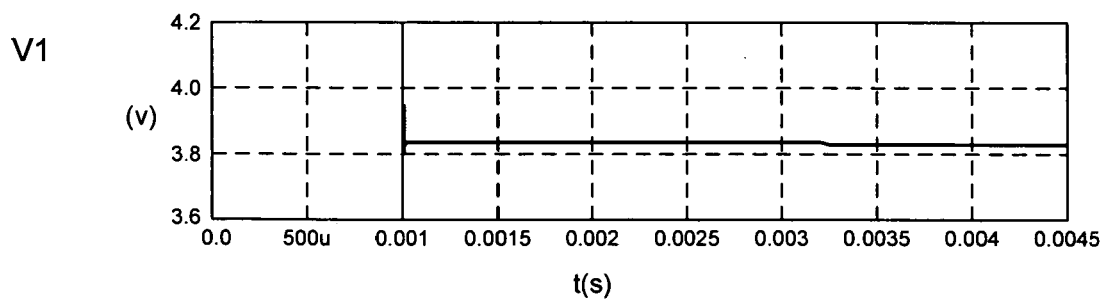

FIGS. 2A, 3A and 4A depict exemplary waveforms of an ignition primary current, the drive current I1 current and the V1 voltage, respectively, as a function of time, for a prior art automotive ignition system. FIGS. 2B, 3B and 4B depict exemplary waveforms of the ignition primary current, the drive current I1 current and the V1 voltage, respectively, as a function of time, for an automotive ignition system including a drive current stabilization circuit 106 constructed according to the present invention. As is evident from comparing the signals of FIGS. 3A and 3B, the drive current I1 is significantly more constant during IGBT gate capacitance charging, when the gate is fully charged and when the gate voltage is reduced by current limit control. As is also evident from comparing the signals of FIGS. 4A and 4B, the voltage V1 is substantially more constant, when the gate is fully charged, as well as when the gate voltage is reduced by the current limit control.

Figure 5:
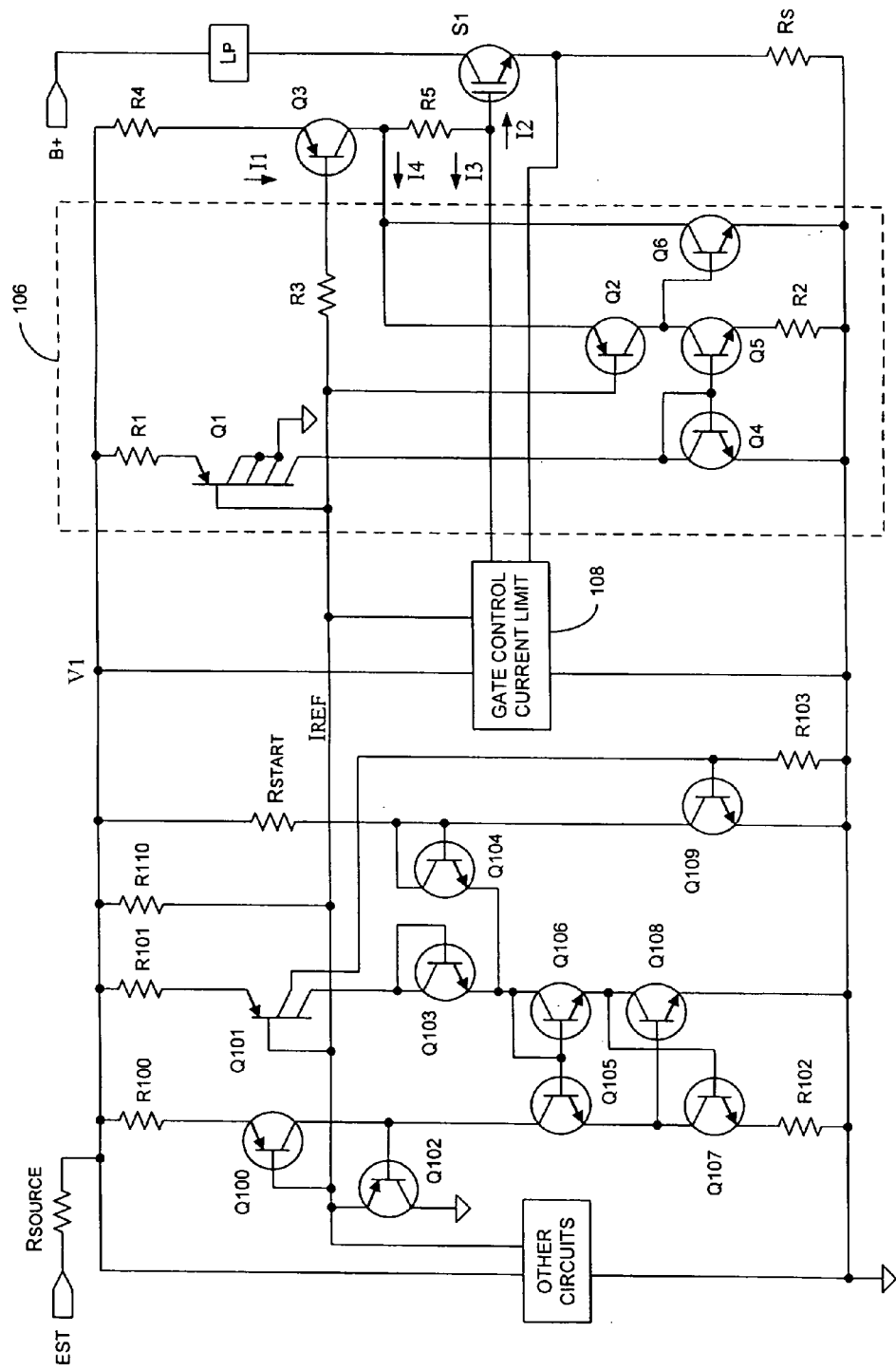
FIG. 5 is an electrical schematic of a relevant portion of an exemplary automotive ignition system that implements a drive current stabilization circuit constructed according to one embodiment of the present invention.

With reference to FIG. 5, transistor level circuit implementation of the drive current stabilization circuit 106 is depicted in relationship to related components of an ignition control integrated circuit (IC) of an automotive ignition system. Transistors Q100 to Q109 and resistors R100 to R103 form a reference current generator known as a 'Delta Vbe generator'. As is well known to one of ordinary skill in the art, the 'Delta Vbe generator' is a standard building block and has a reference current (Iref) defined by the following equation:

$$Iref = \frac{Vt * \mathrm{Ln}(N)}{Rdvbe}$$

where Vt is the thermal voltage defined by k*T/q, k is Boltzman's constant, T is the temperature in degree Kelvin and q is the electronic charge; N is the ratio of the emitter areas used to develop the Delta VBE current, i.e., transistors Q105 to Q108, and in the disclosed implementation N is set equal to 9; and Rdvbe is the resistance chosen to establish a magnitude of the reference current Iref and corresponds to the value of resistor R102. The reference current Iref is used to drive a current mirror rail, which drives other circuits necessary for operation of the ignition control integrated circuit (IC), along with the gate drive current.

In one embodiment, due to the relative emitter areas of the transistor Q100 and the transistor Q3 and the values of the resistors R100, R3 and R4, the gate drive current I1 is approximately eight times the Iref current. As is shown, the gate charging drive current I1 is provided from a collector of the transistor Q3. When the drive current I1 is initially turned on, the switch S1 gate voltage is low and rises as a gate capacitance of the switch S1 is charged. The current I1, supplied from the collector of the transistor Q3, is used by the gate control current limit circuit 108 or to charge the gate capacitance of the switch S1. At this point, the current I4 is approximately equal to zero as transistors Q2 and Q6 are turned off. The transistor Q2 remains off as long as its emitter voltage is no more than approximately 0.6 Volts greater than its base voltage. The emitter voltage of the transistor Q2 tracks the gate voltage of the switch S1 and its base voltage is defined by the following equation:

$Q2$ base voltage=$V1-[(Iref*R100)+Vbe$ of the transistor $Q100]$

While the switch S1 gate capacitance is charging, the base voltage of the transistor Q2 is higher than its emitter voltage and, as such, the collector of the transistor Q2 does not provide current to turn on the transistor Q6. It should be appreciated that the transistors Q100, Q1, Q4 and Q5 and resistors R100, R1 and R2 create two current mirrors that discharge and maintain a low state on the base of the transistor Q6, when the transistor Q2 is off. These current mirrors are configured to create a current that is a reduced version of the reference current Iref. It is desirable that this current be relatively small, e.g., a few microamperes, which allows the drive current stabilization circuit to become active when the base voltage of the transistor Q2 is only slightly below the emitter voltage of the transistor Q2. This occurs when the transistor Q3 approaches saturation and the collector voltage of the transistor Q3 approaches the base voltage of the transistor Q3. When the transistor Q3 approaches saturation, its base current increases, thereby creating an additional voltage drop across the resistor R3, lowering the base voltage of the transistor Q2 relative to its emitter voltage.

It should be appreciated that if the transistor Q3 is allowed to be driven deep into saturation, the overall current draw of the component will reduce as the current output of the transistor Q3 decreases. However, according to the present invention, the transistor Q2 begins to conduct current when the transistor Q3 begins to saturate. When the current conducted by the transistor Q2 overcomes the pull-down current of the transistor Q5, the transistor Q6 begins to turn on and the voltage at the collector of the transistor Q3 is maintained, which keeps the transistor Q3 from being driven into hard saturation. This eliminates the undesired change in the collector current of the transistor Q3.

The current I2 that was previously charging the switch S1 gate capacitance is now diverted to ground, via the transistor Q6. As such, the drive current I1 remains substantially unchanged. When the ignition coil primary winding current limit is reached, the gate control current limit 108 increases the current I3 to reduce the switch S1 gate voltage. As this reduces the voltage at the emitter of the transistor Q2, the current flow from the collector of the transistor Q2 is stopped and the transistor Q6 is turned off, which ends the current I4 flow. In this manner, the overall current I1 is relatively unchanged since the current I4 that was flowing through the transistor Q6 is now used by the gate control current limit 108.

Accordingly, a drive current stabilization circuit has been described herein that enhances drive current stabilization, which reduces undesired oscillation in a current carried by a primary winding of an ignition coil of an automotive ignition system.

The above description is considered that of the preferred embodiments only. Modifications of the invention will occur to those skilled in the art and to those who make or use the invention. Therefore, it is understood that the embodiments shown in the drawings and described above are merely for illustrative purposes and not intended to limit the scope of the invention, which is defined by the following claims as interpreted according to the principles of patent law, including the doctrine of equivalents.

The invention claimed is:

1. An automotive subsystem, comprising:
   an ignition coil including a primary winding having a first side and a second side, wherein the first side of the primary winding is coupled to a power source;
   a switch including a first output terminal, a second output terminal and a control terminal, wherein the first output terminal is coupled to the second side of the primary winding and the second output terminal is coupled to a common return;
   a current source providing a drive current; and
   a drive current stabilization circuit coupled between the current source and the control terminal of the switch, wherein the drive current stabilization circuit divides the drive current into a control current that is provided to the control terminal of the switch, a current limit input current that is provided to a current limit circuit associated with the switch and a stabilization current, and wherein the switch carries a load current responsive to a magnitude of a control signal on the control terminal, where the magnitude of the stabilization current is increased responsive to a decrease in a magnitude of the control current to substantially maintain a magnitude of the drive current.

2. The subsystem of claim 1, wherein the drive current stabilization circuit reduces the magnitude of the stabilization current responsive to an increase in the magnitude of the current limit input current to substantially maintain a magnitude of the drive current.

3. The subsystem of claim 1, wherein the switch is one of an insulated-gate bipolar transistor (IGBT) or a field-effect transistor (FET).

4. An automotive subsystem, comprising:
   an ignition coil including a primary winding having a first side and a second side, wherein the first side of the primary winding is coupled to a power source;
   a switch including a first output terminal, a second output terminal and a control terminal, wherein the first output terminal is coupled to the second side of the primary winding and the second output terminal is coupled to a common return;
   a current source providing a drive current; and
   a drive current stabilization circuit coupled between the current source and the control terminal of the switch, wherein the drive current stabilization circuit divides the drive current into a control current that is provided to the control terminal of the switch and a stabilization current, and wherein the switch carries a load current between the first and second output terminals responsive to a control signal on the control terminal, where the magnitude of the stabilization current is increased responsive to a decrease in a magnitude of the control current to substantially maintain a magnitude of the drive current.

5. The subsystem of claim 4, wherein the drive current further includes a current limit input current that is provided to a current limit circuit.

6. The subsystem of claim 5, wherein the current limit circuit monitors the load current through the switch and increases the current limit input current when the load current obtains a desired level.

7. The subsystem of claim 5, wherein the drive current stabilization circuit reduces the magnitude of the stabilization current responsive to an increase in the magnitude of the current limit input current to substantially maintain a magnitude of the drive current.

8. The subsystem of claim 4, wherein the switch is one of an insulated-gate bipolar transistor (IGBT) or a field-effect transistor (FET).

* * * * *